United States Patent
Li et al.

(10) Patent No.: US 9,583,693 B2
(45) Date of Patent: Feb. 28, 2017

(54) PIEZOELECTRIC ENERGY HARVESTER

(71) Applicant: NANYANG TECHNOLOGICAL UNIVERSITY, Singapore (SG)

(72) Inventors: Tao Li, Singapore (SG); Ying Wang, Singapore (SG); Pooi See Lee, Singapore (SG)

(73) Assignee: NANYANG TECHNOLOGICAL UNIVERSITY, Singapore (SG)

( * ) Notice: Subject to any disclaimer, the term of this patent is extended or adjusted under 35 U.S.C. 154(b) by 0 days.

(21) Appl. No.: 14/762,270

(22) PCT Filed: Feb. 28, 2014

(86) PCT No.: PCT/SG2014/000095
§ 371 (c)(1),
(2) Date: Jul. 21, 2015

(87) PCT Pub. No.: WO2014/133464
PCT Pub. Date: Sep. 4, 2014

(65) Prior Publication Data
US 2015/0357943 A1    Dec. 10, 2015

Related U.S. Application Data

(60) Provisional application No. 61/770,822, filed on Feb. 28, 2013.

(51) Int. Cl.
*H01L 41/113* (2006.01)
*H02N 2/18* (2006.01)

(52) U.S. Cl.
CPC ........... *H01L 41/1138* (2013.01); *H02N 2/18* (2013.01)

(58) Field of Classification Search
CPC ........... H02N 2/18; H02N 2/186; H02N 2/188
USPC ............................................. 310/339
See application file for complete search history.

(56) References Cited

U.S. PATENT DOCUMENTS

| | | | | |
|---|---|---|---|---|
| 3,239,678 A | * | 3/1966 | Kolm | F23Q 2/287 102/210 |
| 3,751,690 A | * | 8/1973 | Okamoto | F23Q 3/002 310/339 |
| 7,443,082 B2 | * | 10/2008 | Grumm | A61B 5/4818 310/339 |
| 2009/0195226 A1 | | 8/2009 | Abramovich et al. | |
| 2010/0072859 A1 | * | 3/2010 | Jager | H01L 41/1138 310/323.21 |

(Continued)

FOREIGN PATENT DOCUMENTS

WO    WO2014133464 A1    9/2014

OTHER PUBLICATIONS

Foreign Communication From a Related Counterpart Application, International Search Report and Written Opinion dated Apr. 30, 2014, International Application No. PCT/SG2014/000095 filed on Feb. 28, 2014.

*Primary Examiner* — J. San Martin

(57) ABSTRACT

A piezoelectric energy harvester comprising: a metal substrate comprising a planar part, a first leg projecting from the planar part and a second leg projecting from the planar part, the metal substrate configured to support a piezoelectric matrix on the planar part between the first leg and the second leg; and a piezoelectric matrix provided on the substrate, the piezoelectric matrix comprising a plurality of adjacent PZT elements.

8 Claims, 4 Drawing Sheets

(56) References Cited

U.S. PATENT DOCUMENTS

| | | | | |
|---|---|---|---|---|
| 2010/0308592 A1* | 12/2010 | Frayne | ................... | H02N 2/185 290/54 |
| 2011/0227456 A1* | 9/2011 | Horiguchi | ........... | B60C 23/0411 310/339 |
| 2013/0181578 A1* | 7/2013 | Kameda | .............. | B60C 23/0411 310/339 |

* cited by examiner

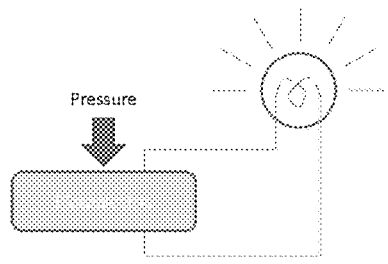 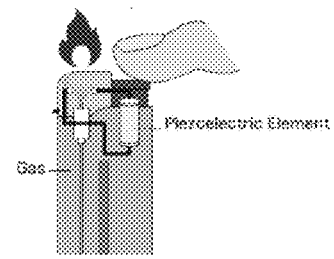
Fig. 1 (prior art)    Fig. 2 (prior art)
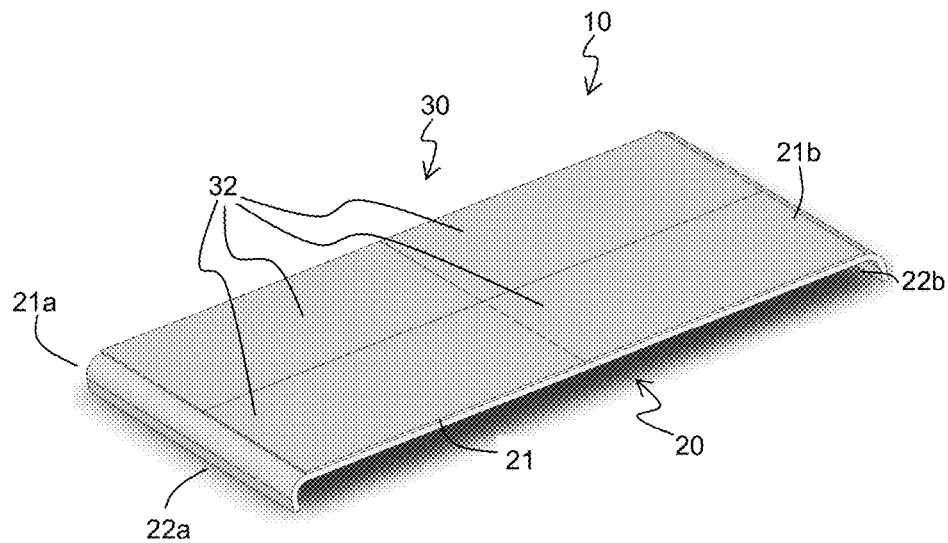
Fig. 3a
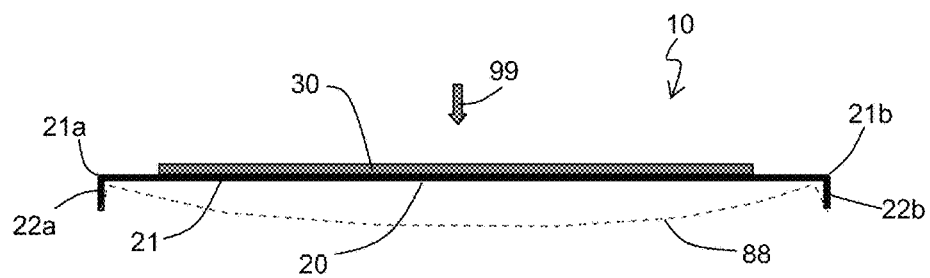
Fig. 3b

PIEZOELECTRIC ENERGY HARVESTER

CROSS-REFERENCE TO RELATED APPLICATIONS

This application is a 371 national stage filing of International Application Number PCT/SG2014/000095 entitled, "A PIEZOELECTRIC ENERGY HARVESTER," filed on Feb. 28, 2014, which claims priority to U.S. Provisional Application No. 61/770,822 filed on Feb. 28, 2013 and entitled "A PIEZOELECTRIC ENERGY HARVESTER," both of which are incorporated herein by reference in their entirety for all purposes.

FIELD OF THE INVENTION

This invention relates to piezoelectric energy harvesters, and particularly, to a PZT energy harvester.

BACKGROUND OF THE INVENTION

Piezoelectric energy harvester/generator uses direct piezoelectric effect to convert mechanical energy to electric energy. For example, as shown in FIG. 1 (prior art), a direct piezoelectric effect may be obtained by applying pressure to a piezoelectric energy harvester/generator to light a bulb. The most familiar application of piezoelectric energy harvester/generator effect is a piezoelectric igniter as shown in FIG. 2 (prior art) where mechanical shock is converted to electricity to create a spark to ignite gas and generate a flame.

Driven by the micro, nano and green energy technologies, new developments and more applications of energy harvesting/generating devices are emerging, such as in wireless sensor networks; in military, sports and health equipment; and in communication and control devices. For instance, a wireless sensor network may contain up to thousands of sensor nodes. Replacement of batteries of sensors is therefore tiring, tedious and inconvenient, especially in harsh environments such as those facing extreme temperatures (e.g. polar regions), pollution (e.g. of air, water) and dangerous situations (e.g. volcanic eruptions). Energy harvesting collects the energy from the environment and therefore provides unlimited energy usage. A piezoelectric energy harvester is able to generate energy in the order of μW to mW, sufficient for many sensor node applications. In military applications, as the soldier needs to carry a heavy load which might induce back injuries and affect movement of the soldier, assisting walking and reducing the load (from equipment batteries) becomes necessary. Biomechanical energy harvesting is able to generate power in the order of W, which can be used to charge batteries, GPS and other equipment. In communication and control devices, to reduce the power consumption and decrease the possibility of pollution, reducing the usage of batteries is necessary. Energy harvesting devices can be used for some applications, such as TV controllers and signal transmitters.

Global demand on piezoelectric energy harvesters have been estimated at approximately US $1 billion in 2010. It is expected to grow by around 7.5-8% annually over the next few years. The total market is expected to increase to US $1.5 billion by 2015 and reach US 1.9 billion by 2018. The above data shows that piezoelectric energy harvesting has been an important area which pushes the growth of the economy.

Accordingly, governments all over the world have input large amounts of energy and resources in this area. This is led by Europe, US and Japan.

However, one of the problems that restrict the wide application of the energy harvester is the cost. PI developed a kind of DuraAct™ patch transducer. The price is SGD211 per piece. The Piezo Systems, Inc. developed another bending type piezo energy harvester. However the price is SGD274 per piece. The Face International Corporation published another Thunder type energy harvester, referred to hereafter as the Thunder transducer, which is based on a NASA invention. It is relatively cheap and may be considered an industry benchmark. However it is still more than USD100 per piece. Therefore, this work aims to develop a piezoelectric energy harvester with better performance while maintaining a low cost.

SUMMARY OF INVENTION

A piezoelectric energy harvester is developed, having similar properties as that of the commercial thunder transducer but with a simpler structure and much lower cost. Based on the technology established, a series energy harvester and other transducers can also be developed. The current invention can be readily used in various fields such as, but not limited to, signal control, signal transmission, communication, wireless sensors, toys, military and sports equipment. The method and apparatus disclosed in this application offer the following advantages:

(a) a simple structure compared to the thunder energy harvester which has a layered structure resulting in the difficulty of fabrication and increases the cost;
(b) a simple fabrication technique that is easy for both low quantity and mass production;
(c) a low cost as less and cheap materials and techniques can be used;
(d) similar output property with a similar size compared with the thunder transducer;
(e) reliability provided by an internal protection mechanism; and
(f) ease of handling and being more compatible with other techniques.

According to a first aspect, there is provided a piezoelectric energy harvester comprising: a metal substrate comprising a planar part, a first leg projecting from the planar part and a second leg projecting from the planar part, the metal substrate configured to support a piezoelectric matrix on the planar part between the first leg and the second leg; and a piezoelectric matrix provided on the substrate, the piezoelectric matrix comprising a plurality of adjacent PZT elements.

The piezoelectric energy harvester may be configured to receive a force applied to the piezoelectric matrix such that the piezoelectric matrix experiences only compressive stresses without experiencing tensile stresses.

The first leg and the second leg may be configured to limit displacement of the piezoelectric energy harvester to be within a safe range of the mechanical strength of the piezoelectric matrix.

The first leg may be contiguous with a first edge of the planar part and the second leg may be contiguous with a second edge of the planar part, the first edge being opposite the second edge.

The polarity, size and location of each PZT element may be configurable according to a desired application of the piezoelectric energy harvester.

The planar part, the piezoelectric matrix and each PZT element may be rectangular in shape.

BRIEF DESCRIPTION OF FIGURES

In order that the invention may be fully understood and readily put into practical effect there shall now be described by way of non-limitative example only exemplary embodiments of the present invention, the description being with reference to the accompanying illustrative drawings.

FIG. 1 (prior art) is an illustration of a direct piezoelectric effect;

FIG. 2 (prior art) is an illustration of a piezoelectric energy harvester/generator in the form of a piezoelectric igniter;

FIG. 3a is a schematic perspective view of a piezoelectric energy harvester according to the present invention;

FIG. 3b is a schematic side view of the piezoelectric energy harvester of FIG. 3a;

FIG. 4 is a graph of an output of the piezoelectric energy harvester of FIG. 3a;

FIG. 5 is a schematic illustration of one embodiment of a circuit diagram of the piezoelectric energy harvester of FIG. 3a;

DETAILED DESCRIPTION

Figure 4:
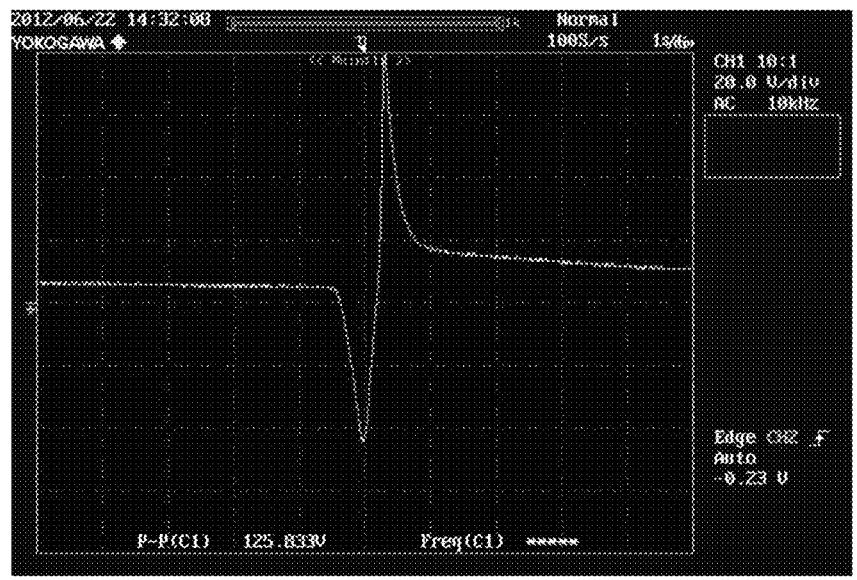

Exemplary embodiments of the invention will be described with reference to FIGS. 3 to 10 below. An exemplary piezoelectric energy harvester 10 according to the present invention is shown in FIGS. 3a and 3b. The piezoelectric energy harvester 10 has two main parts: a metal substrate 20 and a piezoelectric matrix 30 comprising a plurality of lead zirconate titanate (PZT) elements 32.

The metal substrate 20 has a Π shape and may be made of brass, or any other suitable metal. By Π shape, it is meant that the substrate has a generally planar part 21 having two legs 22 provided on either side of the planar part 21. The first leg 22a projects from a first edge 21a of the planar part 21 while the second leg 22b projects from a second edge 21b of the planar part 21, the first edge 21a being opposite the second edge 21b, such that a side view (FIG. 3b) of the substrate 20 has the appearance of a Π shape, albeit with rather short legs 22. The planar part 21 of the substrate 20 is configured to support the PZT matrix 30 thereon, and is preferably rectangular in shape. The legs 22 are preferably integrally formed with the planar part 21. Each leg 22 preferably projects orthogonally from the planar part 21 and is preferably contiguous with an edge 21a or 21b of the planar part 21, as can be seen in FIG. 3a.

On top of the metal substrate 20 is the PZT matrix 30 which comprises a number of flat PZT elements 32 adjacent to each other to form a larger piece of PZT. The size, location and polarity of each PZT element 32 may be adjusted to suit a desired application of the device 10. Each PZT element 32 is preferably rectangular in shape. The two main parts 20, 30 are adhered together, preferably using an epoxy adhesive.

The energy harvester 10 is designed to respond to a force (or displacement) applied to the top of the energy harvester 10, that is, to the PZT matrix 30, downwardly into the substrate 20. When the force is applied, as shown in FIG. 3b by the arrow 99, the energy harvester 10 will deform and turn to the bending shape as indicated by the dashed line 88. As a result, electrical charges will be generated due to the direct piezoelectric effect. According to the direct piezoelectric effect, the deformation of the PZT elements 32 of the PZT matrix 30 will induce charges on its surface. The output voltage is related to the induced charges or charges generated according to equation (1) below:

$$V=Q/C \qquad (1)$$

where V is the output voltage, Q is the charges generated and C is the capacitance of the harvester.

Output of the energy harvester 10 is shown in the graph of FIG. 4. The output is obtained by a single press at the centre of the energy harvester 10. A peak-to-peak voltage of nearly 125 Vpp was obtained. This magnitude is similar to that obtained using the Thunder transducer. In this embodiment, the output of all the PZT elements 32 are connected together to give a combined output voltage from all the PZT elements 32.

Figure 5:
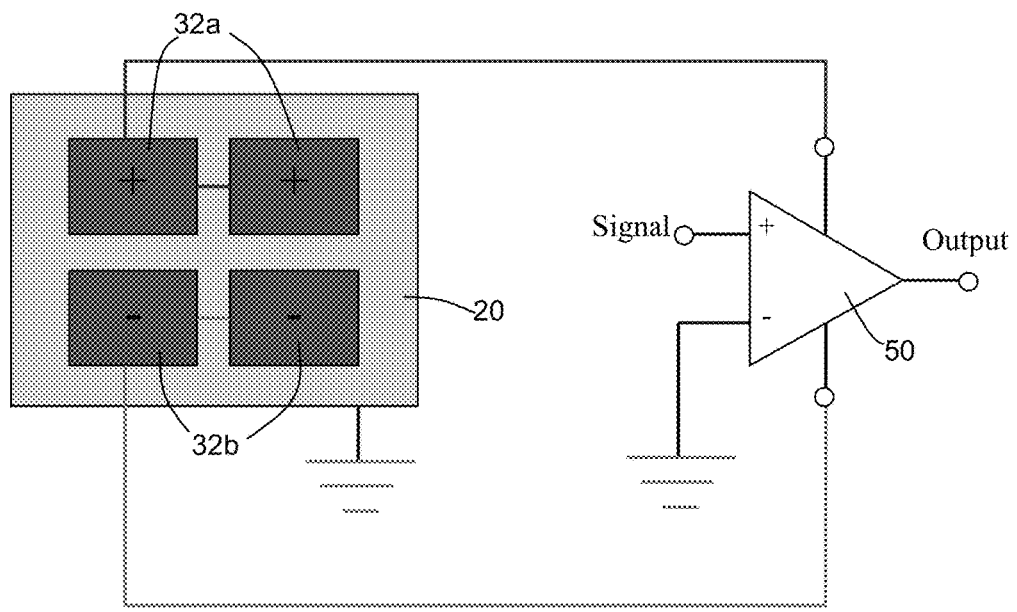

In another embodiment as shown in FIG. 5, PZT elements having a positive polarity 32a are connected together, while PZT elements having a negative polarity 32b are connected together, at the same time ensuring that the two groups of PZT elements 32a and 32b having different polarities are not connected. This ensures that the output of one group will not cancel the other, and that both groups 32a and 32b work as two separate PZT energy harvesters providing power to another circuit element, such as an operational amplifier 50. This configuration satisfies the requirements of some electric circuits, such as those using operational amplifiers, that need two power supplies with opposite polarity, for example (−5 to 0 to 5 V), in order to function. With this alternative embodiment of the PZT energy harvester 10, no additional power source will be required. The PZT matrix 30 thus provides a possibility to create both positive and negative charges in the device 10 at the same time simply by configuring the polarity of the PZT elements 32 appropriately.

Configuring the energy harvester 10 to have the PZT matrix 30 on top of the substrate 20 ensures that the PZT matrix 30 can only be under compressive stress when the force is applied from above as indicated by the arrow 99. PZT is a brittle material, which is easy to fracture under tensile stress. Thus, the present configuration protects the PZT matrix 30 by allowing it to experience only compressive stresses when in use, without experiencing tensile stresses.

Having a Π-shaped design confines stress applied to the energy harvester 10 as the two legs 22 of the substrate 20 limit allowable displacement of the energy harvester 10. Accordingly, this limits the maximum compressive stress of the energy harvester. Thus, appropriate configuration of the length of the two legs 22 of the substrate 20 may be made to ensure that the compressive stress of the PZT matrix 30 is always in the safe range. This allows the device 10 to always work within the safe range of the mechanical strength the PZT matrix 30, thereby significantly improving the life time and reliability of the device 10. The Π-shaped design also improves output consistency of the device 10 as the configuration of the device 10 confines its deformed shape.

Forming the PZT matrix 30 from a plurality of smaller PZT elements 32 lowers the total cost of the device as fabrication of a single large piece of PZT is more difficult and expensive. The planar part 21 of the substrate 20, the PZT elements 32 and the PZT matrix 30 are preferably rectangular in shape. The PZT matrix 30 also provides opportunity for stress optimization as each PZT element 32, being at a different location with respect to the applied force 99, will experience a different level of stress. By using a matrix 30 composed of smaller elements 32, the deformation and stress level of each PZT element 32 can be optimized based on its location, thereby helping to maximize the output of the energy harvester 10.

A comparative performance test was carried out under maximum displacement conditions of the present device 10 and of the Thunder transducer. The dimensions of the energy harvester 10 tested were 80 mm×85 mm×4 mm (27200 mm$^3$). The length of the legs 32 was a little less than 4 mm. Maximum displacement was approximately 4 mm. By comparison, the Thunder transducer has dimensions of 73 mm×96 mm×9 mm (65664 mm$^3$). The displacement of the Thunder transducer is approximately that of its dome height, i.e. 9 mm.

Figure 6:
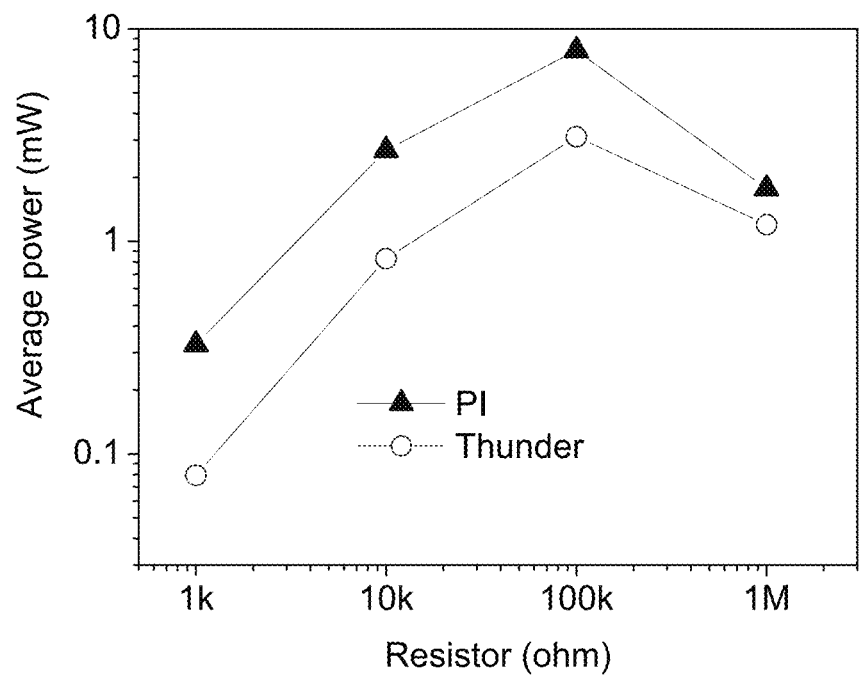
FIG. 6 is a graph of output power of an exemplary piezoelectric energy harvester and of a Thunder transducer.
Figure 7:
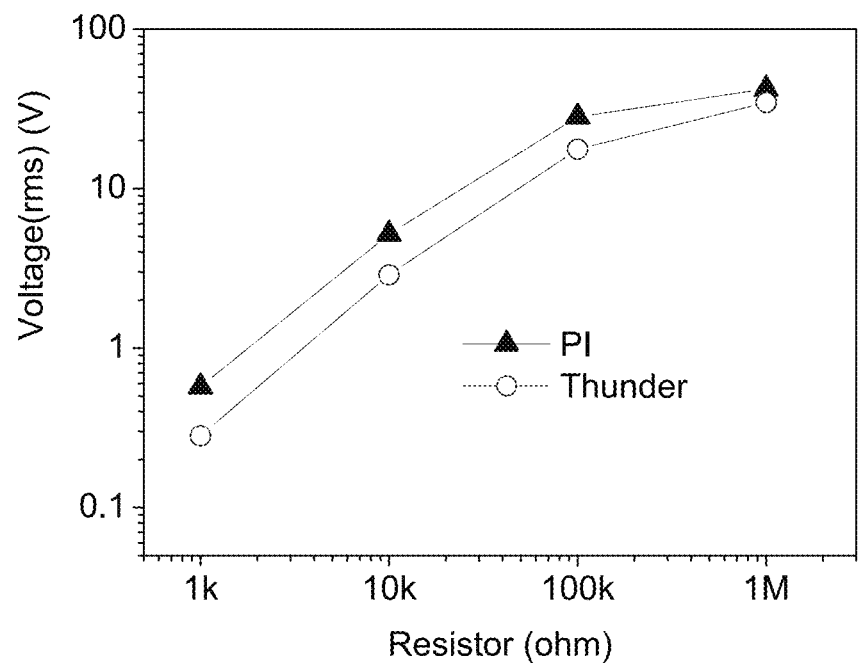
FIG. 7 is a graph of output rms voltage of an exemplary piezoelectric energy harvester and of a Thunder transducer.
Figure 8:
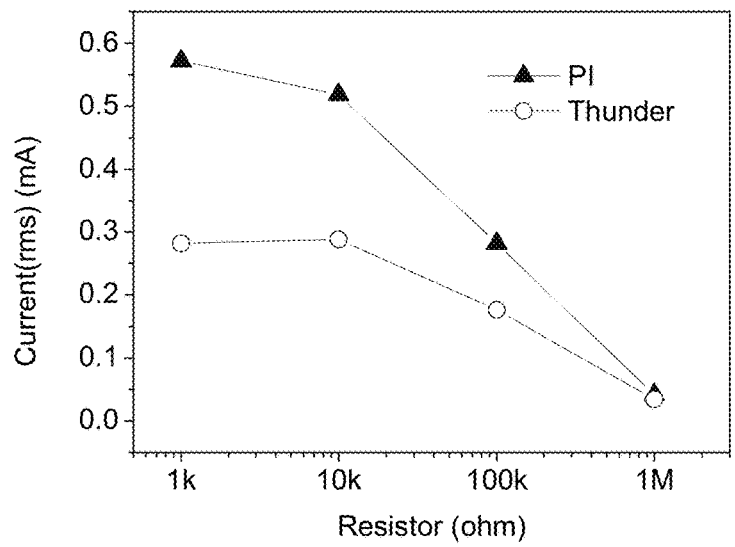
FIG. 8 is a graph of output rms current of an exemplary piezoelectric energy harvester and of a Thunder transducer.

FIG. 6 shows a comparison of the power output of the present energy harvester 10 (indicated as PI) with the Thunder transducer (indicated as Thunder). Evidently, the present energy harvester 10 is able to generate more power than the Thunder transducer. It should be noted that output power is sensitive to load resistance, and that at the impedance matching condition, the output power is maximum. FIGS. 7 and 8 show the rms voltage and current comparisons between the present energy harvester 10 (indicated as PI) and the Thunder harvester (indicated as Thunder). It can be seen that the present energy harvester 10 has a better performance than the Thunder harvester by producing a higher rms voltage and current when given the same resistor values.

The life time of the device 10 is estimated to be greater than $10^9$ cycles when the stress or applied force is below 30 MPa. This means that if the energy harvester 10 is pressed 1000 times a day, the life time will be more than 2700 years.

The accessory circuit (not shown) of the device 10 is configured to be adjustable, thereby allowing voltage output to be adjusted and thereby simplifying the circuitry of the device 10. This is very important for an energy harvester circuit as most of the currently available ones have voltage limitations, whereas the present device 10 has high voltage availability.

Although the substrate is Π-shaped, the legs 22 are significantly shorter than the length and width of the planar part 21 of the device 10 so that the device 10 is still more space saving compared to other devices such as the Thunder transducer. Accordingly, the present device 10 is low cost, space saving, robust, and also easy to scale up and mass produce. The device is also reliable with a long life time due to the optimized stress level as a result of using smaller PZT elements 32 to form the larger PZT matrix 30, while being able to generate both positive and negative voltage at the same time.

Figure 9:
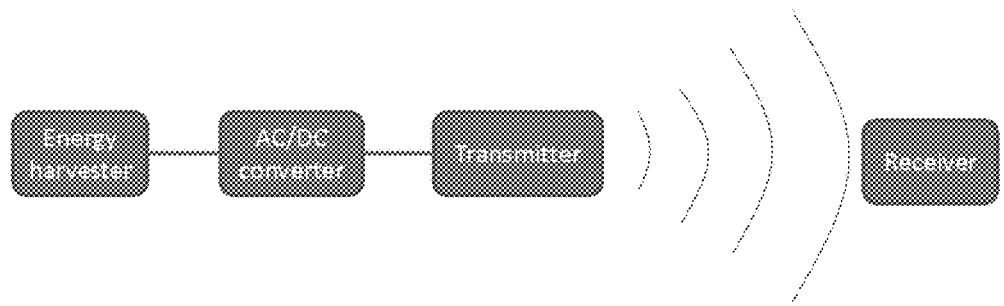
FIG. 9 is a schematic illustration of a signal transmitter using the piezoelectric energy harvester of the present invention.
Figure 10:
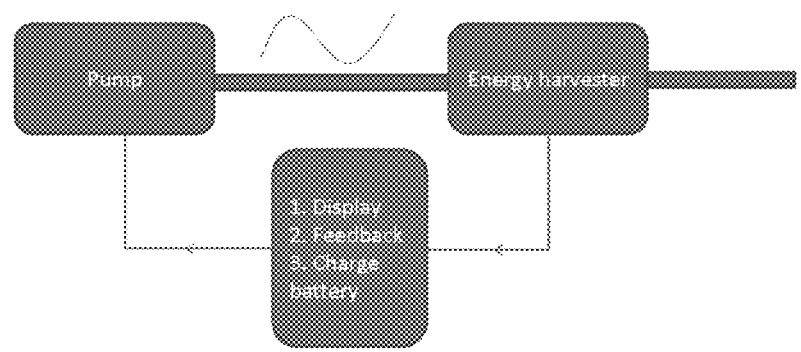
FIG. 10 is a schematic illustration of flow system monitoring and control using the piezoelectric energy harvester of the present invention.

Possible applications of the piezoelectric harvester 10 include a signal transmitter as shown in FIG. 9 in which a mechanical agitation will generate a signal, which will be transmitted to a receiver for the control purposes. Examples of signal transmitter applications include a wireless footpad, a wireless door bell, counters, on/off switches. Another possible application may be in monitoring and controlling a flow system, as shown in FIG. 10. In a liquid flow system, the flow rate is mostly not constant, especially for flows that are piston pump driven flow. In this application, fluctuation of the liquid pressure generates vibration of the energy harvester and as a result, the vibration energy can be harvested for various purposes such as providing a display, to charge a battery, and it may also be used as a feedback to control the flow of the system.

Whilst there has been described in the foregoing description exemplary embodiments of the present invention, it will be understood by those skilled in the technology concerned that many variations in details of design, construction and/or operation may be made without departing from the present invention.

The invention claimed is:

1. A piezoelectric energy harvester comprising:
    a metal substrate comprising
        a planar part,
        a first leg projecting from the planar part and
        a second leg projecting from the planar part, the metal substrate configured to support a piezoelectric matrix on the planar part between the first leg and the second leg; and
    a piezoelectric matrix provided on the substrate, the piezoelectric matrix comprising a plurality of adjacent PZT elements.

2. The piezoelectric energy harvester of claim 1, wherein the piezoelectric matrix is provided on top of the substrate and experiences only compressive stresses without experiencing tensile stresses when a force is applied downwardly onto the piezoelectric matrix.

3. The piezoelectric energy harvester of claim 1, wherein the first leg and the second leg are configured to limit displacement of the piezoelectric energy harvester to be within a safe range of the mechanical strength of the piezoelectric matrix.

4. The piezoelectric energy harvester of claim 3, wherein the first leg is contiguous with a first edge of the planar part and the second leg is contiguous with a second edge of the planar part, the first edge being opposite the second edge.

5. The piezoelectric energy harvester of claim 1, wherein the polarity, size and location of each PZT element is configurable according to a desired application of the piezoelectric energy harvester.

6. The piezoelectric energy harvester of claim 1, wherein the planar part, the piezoelectric matrix and each PZT element are rectangular in shape.

7. The piezoelectric energy harvester of claim 1, wherein output of all the plurality of PZT elements are connected together to give a combined output voltage.

8. The piezoelectric energy harvester of claim 1, wherein PZT elements having a positive polarity among the plurality of PZT elements are connected together and PZT elements having a negative polarity among the plurality of PZT elements are connected together, and wherein PZT elements having different polarity among the plurality of PZT elements are not connected together.

* * * * *